US012522946B2

(12) United States Patent
Wang et al.

(10) Patent No.: US 12,522,946 B2
(45) Date of Patent: Jan. 13, 2026

(54) UPPER CYLINDER APPLIED IN SINGLE CRYSTAL FURNACE AND INCLUDING BOSS FOR PLACING COVER PLATE OF DIVERSION CYLINDER

(71) Applicant: TCL ZHONGHUAN RENEWABLE ENERGY TECHNOLOGY CO., LTD., Tianjin (CN)

(72) Inventors: Jianlong Wang, Tianjin (CN); Jian Xu, Tianjin (CN); Lei An, Tianjin (CN); Jianping Wang, Tianjin (CN); Lin Wang, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 272 days.

(21) Appl. No.: 18/548,087

(22) PCT Filed: Jun. 29, 2023

(86) PCT No.: PCT/CN2023/103869

§ 371 (c)(1),
(2) Date: Aug. 26, 2023

(87) PCT Pub. No.: WO2024/016994

PCT Pub. Date: Jan. 25, 2024

(65) Prior Publication Data

US 2025/0034747 A1 Jan. 30, 2025

(30) Foreign Application Priority Data

Jul. 18, 2022 (CN) ......................... 202221852912.8

(51) Int. Cl.
*C30B 35/00* (2006.01)
*C30B 15/14* (2006.01)

(52) U.S. Cl.
CPC .................................... *C30B 15/14* (2013.01)

(58) Field of Classification Search
CPC ......... C30B 15/00; C30B 15/02; C30B 15/14; C30B 29/00; C30B 29/02; C30B 29/06; C30B 35/00; C30B 35/002
(Continued)

(56) References Cited

U.S. PATENT DOCUMENTS

2009/0249998 A1* 10/2009 Inami ..................... C30B 15/10
117/217

FOREIGN PATENT DOCUMENTS

CN 202730297 U * 2/2013
CN 106894079 A 6/2017
(Continued)

OTHER PUBLICATIONS

International Search Report in International application No. PCT/CN2023/103869,mailed on Sep. 22, 2023.
(Continued)

*Primary Examiner* — Kenneth A Bratland, Jr.
(74) *Attorney, Agent, or Firm* — PV IP PC; Peter S. Stecher; Wei Te Chung

(57) ABSTRACT

An upper cylinder for single crystal furnace is provided, wherein the upper cylinder includes an upper cylinder body. A boss is disposed on an inner bottom of the upper cylinder body, and is configured to place a cover plate of a diversion cylinder. The upper cylinder body is disposed on a thermal insulation layer of the single crystal furnace, and the cover plate of the diversion cylinder drives the diversion cylinder to move up and down inside the upper cylinder body, so that a heat loss is prevented by the upper cylinder body.

20 Claims, 2 Drawing Sheets

(58) Field of Classification Search
USPC ....... 117/11, 13, 30, 33, 200, 206, 208, 214, 117/217, 928, 931–932
See application file for complete search history.

(56) References Cited

FOREIGN PATENT DOCUMENTS

| | | | | | |
|---|---|---|---|---|---|
| CN | 107761162 A | * | 3/2018 | ............. | C30B 15/00 |
| CN | 211814710 U | | 10/2020 | | |
| CN | 218115661 U | | 12/2022 | | |

OTHER PUBLICATIONS

Written Opinion of the International Search Authority in International application No. PCT/CN2023/103869,mailed on Sep. 22, 2023.

* cited by examiner

UPPER CYLINDER APPLIED IN SINGLE CRYSTAL FURNACE AND INCLUDING BOSS FOR PLACING COVER PLATE OF DIVERSION CYLINDER

CROSS-REFERENCE TO RELATED DISCLOSURE

This application claims priority to Chinese Patent Application No. 202221852912.8, filed Jul. 18, 2022, titled "UPPER CYLINDER FOR SINGLE CRYSTAL FURNACE", which is incorporated herein by reference in its entirety.

TECHNICAL FIELD

The present disclosure relates to a technical field of a single crystal furnace, and particularly relates to an upper cylinder for single crystal furnace.

BACKGROUND

With rapid development of the solar photovoltaic industry, a single crystal furnace becomes a main equipment for preparing the single crystal silicon, and a thermal field structure of the single crystal furnace ensures a stable growth of the single crystal silicon, and a diversion cylinder is a part of the thermal field structure. Czochralski method is one of the most commonly used methods for single crystal silicon. In order to reduce the cost on opening the furnace and increase the yield, the single crystal silicon is prepared by taking section out and re-feeding. Re-feeding is a process of re-feeding a second, third or even more crystal rods into a crucible through a secondary feeding process after the first crystal rod is drawn (a certain weight of silicon melt remains in the crucible). During re-feeding, in order to prevent the diversion cylinder from moving deeply into the quartz crucible, occupying more space, and affecting the yield, it is necessary to raise the diversion cylinder to load more silicon materials into the crucible, and then to low the diversion cylinder as a thermal barrier after the silicon materials are melted.

SUMMARY

An upper cylinder for single crystal furnace is provided, which effectively solves the problems of heat dissipation of a thermal field structure of the single crystal furnace in a re-feeding process and low thermal insulation performance.

An upper cylinder for single crystal furnace includes an upper cylinder body, wherein a boss is provided on an inner bottom of the upper cylinder body, the boss is configured to place a cover plate of a diversion cylinder, the upper cylinder body is disposed on an thermal insulation layer of the single crystal furnace, and the cover plate of the diversion cylinder drives the diversion cylinder to move up and down inside the upper cylinder body, so that a heat loss is prevented by the upper cylinder body.

In an embodiment, the upper cylinder body includes a first upper cylinder body and a second upper cylinder body, the first upper cylinder body and the second upper cylinder body are disposed coaxially, the first upper cylinder body is disposed on an upper portion of the second upper cylinder body, and the boss is provided at a position where the first upper cylinder body and the second upper cylinder body are internally connected.

In an embodiment, a length of the first upper cylinder body is greater than a distance of an upward movement of the diversion cylinder, and a length of the second upper cylinder body is less than the length of the first upper cylinder body.

In an embodiment, an inner diameter of the second upper cylinder body is less than an inner diameter of the first upper cylinder body, and the boss is provided at the position where the first upper cylinder body and the second upper cylinder body are internally connected.

In an embodiment, a stopper structure is provided on an end face where the first upper cylinder body and the second upper cylinder body are connected.

In an embodiment, an annular protrusion is provided at a bottom end face of the first upper cylinder body, and an annular groove is provided at a top end face of the second upper cylinder body, wherein the annular protrusion and the annular groove are disposed correspondingly to define the stopper structure.

In an embodiment, an annular groove is provided at a bottom end face of the first upper cylinder body, and an annular protrusion is provided at a top end face of the second upper cylinder body, wherein the annular protrusion and the annular groove are disposed correspondingly to define the stopper structure.

In an embodiment, an axial groove is provided on an inner wall of the first upper cylinder body, the axial groove is extended along an axial direction of the first upper cylinder body, and the axial groove is configured to place a water-cooling guide pipe.

In an embodiment, the axial groove is a U-shaped groove, and has a U-shaped section from a transversal direction.

In an embodiment, two axial grooves are symmetrically provided on the inner wall of the first upper cylinder body.

In an embodiment, a plurality of axial grooves are provided, each two of the plurality of axial grooves are in pair, and axial grooves of each pair are symmetrically provided on the inner wall of the first upper cylinder body.

The disclosure has the advantages and positive effects of reducing the heat loss of the thermal field structure of the single crystal furnace when the above-mentioned upper cylinder is provided, thereby improving the thermal insulation of the thermal field structure, shortening the melting time, improving the production efficiency, and reducing the production cost.

BRIEF DESCRIPTION OF THE DRAWINGS

In order to make the embodiments of the present disclosure or the technical solutions in the prior art more clearly, reference will now be made to the accompanying drawings used in the description of the embodiments or the prior art, and it will be apparent that the accompanying drawings in the description below are merely some of the embodiments of the present disclosure, and other drawings may be made to those skilled in the art without any inventive effort.

Figure 1:
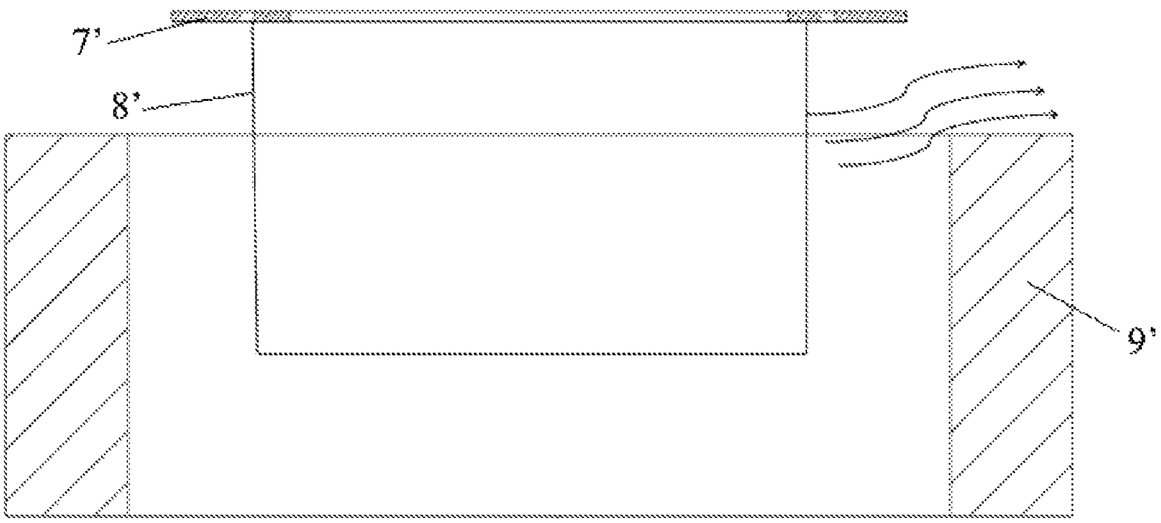
Prior Art FIG. 1
FIG. 1 is a schematic diagram of heat dissipation according to a thermal field structure of a single crystal furnace in prior art.

| reference numerals: | | |
|---|---|---|
| 1. first upper cylinder body | 2. second upper cylinder body | 3. boss |
| 4. annular groove | 5. annular projection | 6. U-shaped groove |
| 7. cover plate | 8. diversion cylinder | 9. upper thermal insulation layer |
| 7'. cover plate in prior art | 8'. diversion cylinder in prior art | 9'. upper thermal insulation layer in prior art |

DETAILED DESCRIPTION OF THE EMBODIMENTS

In order that the above objects, features and advantages of the present disclosure may be more readily understood, reference will now be made in detail to the accompanying drawings. In the following description, numerous specific details are set forth in order to facilitate a thorough understanding of the present disclosure. However, the present disclosure can be practiced in many other ways than those described herein, and those skilled in the art can make similar modifications without departing from the spirit of the present disclosure, and thus the present disclosure is not limited to the specific embodiments disclosed below.

In the description of this disclosure, it should be understood that the azimuth or positional relationship indicated by the terms "center", "longitudinal", "transverse", "length", "width", "thickness", "up", "down", "front", "back", "left", "right", "vertical", "horizontal", "top", "bottom", "inner", "outer", "clockwise", "counterclockwise", "axial", "radial", "circumferential", and the like, is based on the azimuth or positional relationship shown in the accompanying drawings, merely for ease of description of this disclosure and simplification of the description, and is not intended to indicate or imply that the indicated device or element must have a particular azimuth, be constructed and operated in a particular azimuth, and therefore is not to be construed as limiting of this disclosure.

Furthermore, the terms "first" and "second" are used for descriptive purposes only and are not to be construed as indicating or implying relative importance or implying the number of indicated technical features. Thus, the features with "first" and "second" indicate or imply to have at least one of these features. In the description herein, "a plurality of" means at least two, e.g., two, three, etc., unless expressly and specifically defined otherwise.

In the present disclosure, unless expressly defined and defined otherwise, terms such as "mounted", "linked", "connected", "fixed", and the like, should be understood as a border meaning, for example, may be fixedly connection, detachably connection, or a integrally connection; may be a mechanical connection or an electrical connection; may be a directly connection or an indirectly connection by means of an intermediate medium; and may be an internal communication of the two elements or interaction of the two elements, unless expressly defined otherwise. The specific meaning of the above terms in this disclosure may be understood by one of ordinary skill in the art depending on the specific circumstances.

In the present disclosure, unless expressly stated and defined otherwise, the first feature may be "on" or "under" the second feature may mean that the first feature directly contacts with the second feature or indirectly contacts with the second feature through an intermediate medium. And the first feature may be "over", "above" or "up" the second feature may mean that the first feature may be directly above or obliquely above the second feature, or merely indicate that the first feature is higher than the second feature. The first feature may be "beneath", "below" or "down" the second feature may mean that the first feature may be directly above or obliquely under the second feature, or merely indicate that the first feature is shorter than the second feature.

It should be noted that when an element is referred to as being "fixed to" or "disposed in" another element, it means that the element may be directly on another element or an intermediate element may be disposed therebetween. When an element is considered to "be connected to" another element, it means that the element may be directly connected to another element or an intermediate element may be connected therebetween. As used herein, the terms "vertical", "horizontal", "up", "down", "left", "right", and the like are used for purposes of illustration only and are not intended to be the only embodiments.

As shown in FIG. 1, during an upward movement of the diversion cylinder 8', a cover plate 7' is generally higher than an upper thermal insulation layer 9' of a single crystal furnace 100-200 mm, as such, a gap between the diversion cylinder 8' and the upper thermal insulation layer 9' causes a heat loss. This is, the thermal insulation performance of the thermal field structure is weakened during re-feeding, and it takes a long time to melt the material, thus, the production cost is increased, and the production efficiency is reduced.

An upper cylinder for single crystal furnace is provided according to an embodiment of the present disclosure, and an embodiment of the present disclosure is described below with reference to the accompanying drawings.

Figure 2:
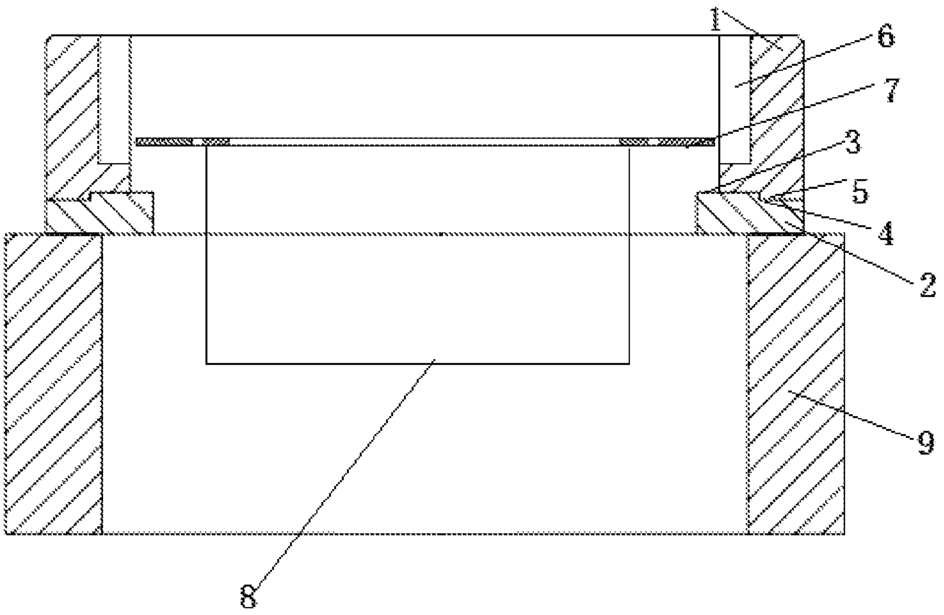
FIG. 2 is a schematic assembled diagram of an upper cylinder for single crystal furnace according to an embodiment of the present disclosure.
Figure 3:
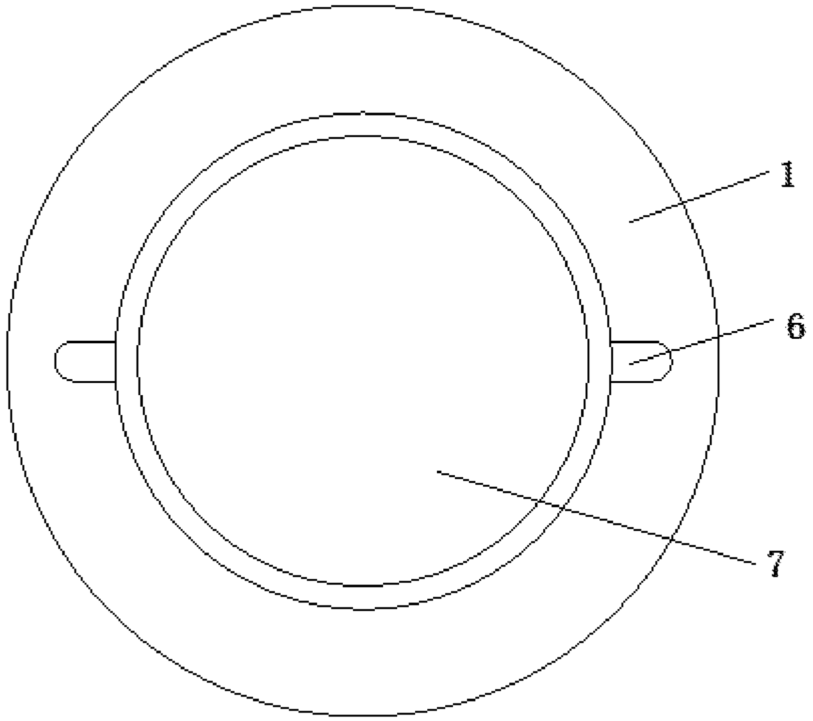
FIG. 3 is a plan view of a schematic assembled diagram of an upper cylinder for single crystal furnace according to an embodiment of the present disclosure.

As shown in FIGS. 2 and 3, an upper cylinder for single crystal furnace according to an embodiment of the present disclosure includes an upper cylinder body, wherein the upper cylinder body is a vertically disposed cylinder body and provided on an upper thermal insulation layer 9 of the single crystal furnace. An annular boss 3 is provided at an inner bottom of the upper cylinder body and extended toward an axial direction of the upper cylinder body. The annular boss 3 is configured to engage with an edge of a cover plate 7 of a diversion cylinder 8. During re-feeding, the cover plate 7 drives the diversion cylinder 8 to move up and down along an inside of the upper cylinder body, thus the heat is prevented by the upper cylinder body from dissipating out of the thermal field structure. The material of the upper cylinder body is not limited, and may be a high-temperature-resistant material such as a cured felt, a carbon/carbon composite material, or isostatic pressing formed graphite.

In an embodiment, the upper cylinder body is designed in a split structure, and the upper cylinder body includes a first upper cylinder body 1 and a second upper cylinder body 2. The first upper cylinder body 1 and the second upper cylinder body 2 are both vertically disposed cylinder bodies, and the first upper cylinder body 1 and the second upper cylinder body 2 are coaxially disposed. The first upper cylinder body 1 is disposed on an upper portion of the second upper cylinder body 2, and the boss 3 is provided at a position where the first upper cylinder body 1 and the second upper cylinder body 2 are internally connected. The boss 3 is extended toward the axes of the first upper cylinder body 1 and the second upper cylinder body 2. The boss 3 is configured to be engaged with the edge of the cover plate 7 of the diversion cylinder 8. With a design in a split structure, the cost on processing can be reduced by 30% compared to an integrated design.

In an embodiment, a length of the first upper cylinder body 1 is greater than a distance of an upward movement of the cover plate 7, and a length of the second upper cylinder body 2 is less than the length of the first upper cylinder body 1. The edge of the cover plate 7 is engaged with the boss 3 located at the position where the first upper cylinder body 1 and the second upper cylinder body 2 are internally connected. During re-feeding, the cylinder cover plate 7 drives the diversion cylinder 8 to move upward. In order to prevent heat loss, the diversion cylinder 8 always moves inside the first upper cylinder body 1. As such, the length of the first upper cylinder body 1 is provided to be greater than the distance of the upward movement of the diversion cylinder 8. In order to ensure the Czochralski method, the diversion cylinder 8, as a part of the thermal field structure, is not distanced far from the upper thermal insulation layer 9, and the diversion cylinder 8 is located at the bottom of the upper cylinder body. Therefore, the length of the second upper cylinder body 2 is not too large and needs to be less than the length of the first upper cylinder body 1.

In an embodiment, an inner diameter of the second upper cylinder body 2 is less than an inner diameter of the first upper cylinder body 1, and the annular boss 3 is provided at the position where the first upper cylinder body 1 and the second upper cylinder body 2 are internally connected, so that the edge of the diversion cylinder cover plate 7 is engaged with the boss 3 to fix the diversion cylinder 8 in overall to the upper cylinder body.

In an embodiment, in order to better position the first upper cylinder body 1 and the second upper cylinder body 2, a stopper structure is provided at an end face where the first upper cylinder body 1 and the second upper cylinder body 2 are connected. The stopper structure includes a convex stopper and a concave stopper. The stopper structure is configured for centering and connecting. The convex stopper and the concave stopper are provided in pairs and matched with each other. In an embodiment, an annular protrusion 5 is provided at the bottom end face of the first upper cylinder body 1, and an annular groove 4 is provided at the top end face of the second upper cylinder body 2. The annular protrusion 5 and the annular groove 4 are disposed correspondingly to define the stopper structure. In an embodiment, an annular groove 4 is provided at the bottom end face of the first upper cylinder body 1, and an annular protrusion 5 is provided at the top end face of the second upper cylinder body 2. The annular groove 4 and the annular protrusion 5 are disposed correspondingly to define the stopper structure.

In an embodiment, an axial groove is provided on an inner wall of the first upper cylinder body 1, and the axial groove is extended along an axial direction of the first upper cylinder body 1. The axial groove is configured to place a water-cooling guide pipe.

In an embodiment, the axial groove is a U-shaped groove 6, and has a U-shaped section from a transversal direction.

In an embodiment, two axial grooves are symmetrically provided on the inner wall of the first upper cylinder body 1. In an embodiment, a plurality of axial grooves are provided, each two of the plurality of axial grooves are in paired, and axial grooves of each pair are symmetrically provided on the inner wall of the first upper cylinder body 1.

As shown in FIGS. 2 and 3, an upper cylinder for single crystal furnace according to an embodiment of the present disclosure includes a first upper cylinder body 1 and a second upper cylinder body 2. The first upper cylinder body 1 and the second upper cylinder body 2 each have a vertically disposed cylinder body, and the length of the first upper cylinder body 1 is greater than the distance of the upward movement of the diversion cylinder 8. The length of the second upper cylinder body 2 is less than the length of the first upper cylinder body 1. The first upper cylinder body 1 is disposed coaxially with the second upper cylinder body 2, the first upper cylinder body 1 is disposed on the second upper cylinder body 2, and the second upper cylinder body 2 is disposed on the thermal insulation layer 9 of the single crystal furnace. The annular protrusion 5 is provided at the bottom end face of the first upper cylinder body 1, and the annular groove 4 is provided at the top end face of the second upper cylinder body 2. The annular protrusion 5 and the annular groove 4 are disposed correspondingly to define the stopper structure for positioning. The outer diameter of the first upper cylinder body 1 is as same as the outer diameter of the second upper cylinder body 2, and the inner diameter of the second upper cylinder body 2 is less than the inner diameter of the first upper cylinder body 1. An annular stepped boss 3 is provided at the position where the first upper cylinder body 1 and the second upper cylinder body 2 are connected. The boss 3 is extended toward axial axes of the first upper cylinder body 1 and the second upper cylinder body 2. The boss 3 is engaged with the edge of the cover plate 7 of the diversion cylinder 8, and the cover plate 7 is fixed with the diversion cylinder 8, thereby fixing the diversion cylinder 8 in overall to the upper cylinder body. Since a water-cooling guide pipe is generally provided on the outer side of the diversion cylinder 8, U-shaped grooves 6 are symmetrically provided on the inner wall of the first upper cylinder body 1 and are provided along the axial direction of the first upper cylinder body 1 to better place the water-cooling guide pipe, thereby facilitating lifting of the diversion cylinder 8. During re-feeding, the cover plate 7 drives the diversion cylinder 8 to move up and down along the inside of the first upper cylinder body 1, and the heat is prevented by the first upper cylinder body 1 from dissipating out of the heat field structure.

The upper cylinder for single crystal furnace is provided. During re-feeding, the diversion cylinder 8 moves inside the upper cylinder, as such, the upper cylinder avoids a heat loss, thereby improving the thermal insulation performance of the thermal field structure, shortening the time for melting the material, and reducing the production cost. Taking a 32-inch thermal field structure of a single crystal furnace with JS120S type as an example, it is possible to save 5 hours as melting per 3000 kg of polysilicon material. A monthly cost is reduced by 5*(100+50)*0.3*1000=225 thousand yuan per month (2.7 million yuan per year), provided that the power for melting the material is 100 KW for main heater and 50 KW for bottom heater, the electricity price is 0.3 yuan per degree, 3000 kg of polysilicon material is melted by one single crystal furnace per month, and the number of the single crystal furnace is 1000. The upper cylinder for single crystal furnace is designed in a split structure to provide a low cost on processing and easy assembly.

The embodiments of the present disclosure have been described in detail above, but the description is only a preferred embodiment of the present disclosure and should not be considered as limiting the scope of implementation of the present disclosure. All equivalents and modifications made in accordance with the scope of the present disclosure is within the scope of the patent of the present disclosure.

What is claimed is:

1. An upper cylinder, applied in a single crystal furnace and configured to be a component of a thermal field structure which is arranged inside the single crystal furnace and further comprises a diversion cylinder and an upper thermal insulation layer, wherein the upper cylinder is structurally independent of the diversion cylinder and the upper thermal insulation layer, the upper cylinder comprises an upper cylinder body configured to be directly disposed on the upper thermal insulation layer without gap, the upper cylinder comprises a cavity inside, and the cavity is configured to be communicated with another cavity of the upper thermal insulation layer to form an accommodating cavity for completely accommodate a cover plate of the diversion cylinder as well as the diversion cylinder; wherein an inner sidewall of the upper cylinder body is inwardly protruded to form a boss at an inner bottom of the upper cylinder body, the boss is configured to place the cover plate of the diversion cylinder, and a depth of a portion of the cavity above the boss is greater than a distance of a feeding movement of the diversion cylinder, such that the cavity of the upper cylinder is configured to allow the cover plate of the diversion cylinder as well as the diversion cylinder to move up and down for feeding while being always located inside the accommodating cavity.

2. The upper cylinder of claim 1, wherein the upper cylinder body comprises a first upper cylinder body and a second upper cylinder body, the first upper cylinder body and the second upper cylinder body are disposed coaxially, the second upper cylinder body is directly disposed on the upper thermal insulation layer without gap, the first upper cylinder body is disposed on an upper side of the second upper cylinder body away from the upper thermal insulation layer, and the boss is provided at a position where the first upper cylinder body and the second upper cylinder body are internally connected.

3. The upper cylinder of claim 2, wherein a length of the first upper cylinder body is greater than the distance of the feeding movement of of the diversion cylinder, and a length of the second upper cylinder body is less than the length of the first upper cylinder body.

4. The upper cylinder of claim 2, wherein an inner diameter of the second upper cylinder body is less than an inner diameter of the first upper cylinder body, and an inner sidewall of the second upper cylinder body is inwardly protruded to form the boss.

5. The upper cylinder of claim 3, wherein an inner diameter of the second upper cylinder body is less than an inner diameter of the first upper cylinder body, and an inner sidewall of the second upper cylinder body is inwardly protruded to form the boss are internally connected.

6. The upper cylinder claim 2, wherein a stopper structure is provided on an end face where the first upper cylinder body and the second upper cylinder body are connected.

7. The upper cylinder claim 3, wherein a stopper structure is provided on an end face where the first upper cylinder body and the second upper cylinder body are connected.

8. The upper cylinder claim 4, wherein a stopper structure is provided on an end face where the first upper cylinder body and the second upper cylinder body are connected.

9. The upper cylinder claim 5, wherein a stopper structure is provided on an end face where the first upper cylinder body and the second upper cylinder body are connected.

10. The upper cylinder of claim 6, wherein an annular protrusion is provided at a bottom end face of the first upper cylinder body, and an annular groove is provided at a top end face of the second upper cylinder body, wherein the annular protrusion and the annular groove are disposed correspondingly to define the stopper structure.

11. The upper cylinder of claim 7, wherein an annular protrusion is provided at a bottom end face of the first upper cylinder body, and an annular groove is provided at a top end face of the second upper cylinder body, wherein the annular protrusion and the annular groove are disposed correspondingly to define the stopper structure.

12. The upper cylinder of claim 8, wherein an annular protrusion is provided at a bottom end face of the first upper cylinder body, and an annular groove is provided at a top end face of the second upper cylinder body, wherein the annular protrusion and the annular groove are disposed correspondingly to define the stopper structure.

13. The upper cylinder of claim 9, wherein an annular protrusion is provided at a bottom end face of the first upper cylinder body, and an annular groove is provided at a top end face of the second upper cylinder body, wherein the annular protrusion and the annular groove are disposed correspondingly to define the stopper structure.

14. The upper cylinder of claim 6, wherein an annular groove is provided at a bottom end face of the first upper cylinder body, and an annular protrusion is provided at a top end face of the second upper cylinder body, wherein the annular protrusion and the annular groove are disposed correspondingly to define the stopper structure.

15. The upper cylinder of claim 7, wherein an annular groove is provided at a bottom end face of the first upper cylinder body, and an annular protrusion is provided at a top end face of the second upper cylinder body, wherein the annular protrusion and the annular groove are disposed correspondingly to define the stopper structure.

16. The upper cylinder of claim 8, wherein an annular groove is provided at a bottom end face of the first upper cylinder body, and an annular protrusion is provided at a top end face of the second upper cylinder body, wherein the annular protrusion and the annular groove are disposed correspondingly to define the stopper structure.

17. The upper cylinder of claim 2, wherein an axial groove is provided on an inner wall of the first upper cylinder body, the axial groove is extended along an axial direction of the first upper cylinder body, and the axial groove is configured to place a water-cooling guide pipe.

18. The upper cylinder of claim 17, wherein the axial groove is a U-shaped groove, and has a U-shaped section from a transversal direction.

19. The upper cylinder of claim 18, wherein two axial grooves are symmetrically provided on the inner wall of the first upper cylinder body.

20. The upper cylinder of claim 18, wherein a plurality of axial grooves are provided, each two of the plurality of axial grooves are in pair, and axial grooves of each pair are symmetrically provided on the inner wall of the first upper cylinder body.

* * * * *